United States Patent [19]
Erckert

[11] Patent Number: 5,914,589
[45] Date of Patent: Jun. 22, 1999

[54] VOLTAGE BOOSTING CIRCUIT FOR HIGH-POTENTIAL-SIDE MOS SWITCHING TRANSISTOR

[75] Inventor: Ricardo Erckert, Bad Aibling, Germany

[73] Assignee: STMicroelectronics, S.r.l., Agrate Brianza, Italy

[21] Appl. No.: 08/923,781

[22] Filed: Sep. 4, 1997

[30] Foreign Application Priority Data

Sep. 4, 1996 [DE] Germany .................. 196 35 912

[51] Int. Cl.⁶ .................................................. G05F 1/56
[52] U.S. Cl. ........................................ 323/282; 323/284
[58] Field of Search .................................. 323/282, 283, 323/284; 327/534, 536, 543

[56] References Cited

U.S. PATENT DOCUMENTS

| | | | |
|---|---|---|---|
| 5,473,283 | 12/1995 | Luich | 331/8 |
| 5,532,636 | 7/1996 | Mar et al. | 327/543 |
| 5,767,735 | 6/1998 | Javanifard et al. | 327/536 |

*Primary Examiner*—Adolf Deneke Berhane
*Attorney, Agent, or Firm*—David V. Carlson; E. Russell Tarleton; Seed and Berry LLP

[57] ABSTRACT

An electric circuit comprising at least one MOS switching transistor disposed on the side of high potential and a switchable charge pump supporting the switching-on phase of the MOS switching transistor at a pumping voltage output thereof with a pumping voltage higher than the potential of the supply voltage on the side of high potential at a pumping voltage output thereof. A control gate of the MOS switching transistor is connectable by means of a controllable switch to a high-potential-side supply voltage terminal or to the pumping voltage output depending on whether a predetermined threshold value on the switching-on ascending edge of the MOS switching transistor signal is exceeded or not.

25 Claims, 4 Drawing Sheets

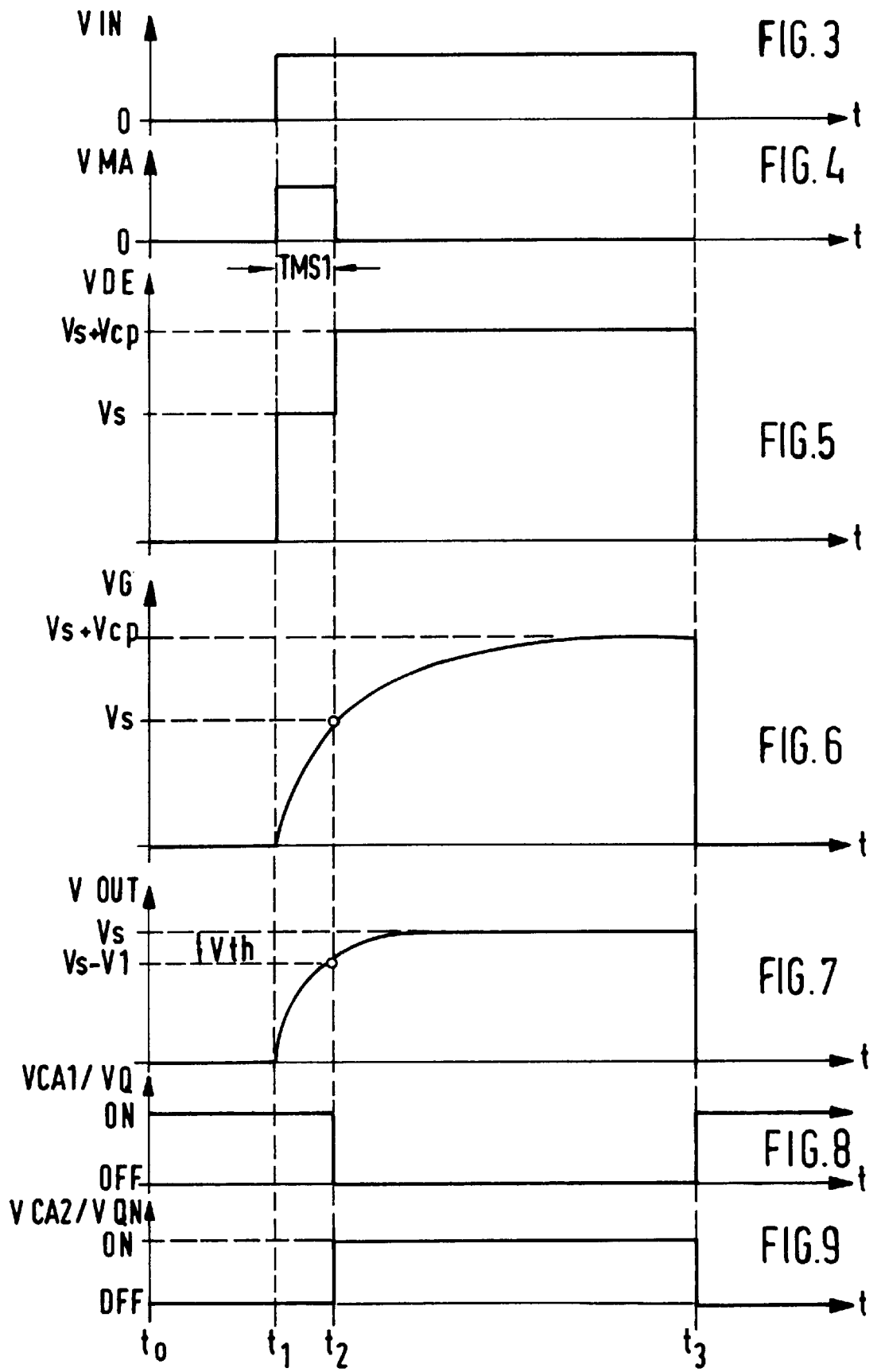

VOLTAGE BOOSTING CIRCUIT FOR HIGH-POTENTIAL-SIDE MOS SWITCHING TRANSISTOR

FIELD OF THE INVENTION

The invention relates to an electric switch circuit and a method of turning on a MOS transistor, and in particular relates to an electric circuit comprising at least one MOS switching transistor disposed on the side of high potential and a charge pump supporting the switching-on phase thereof, with a pumping voltage that is above the potential of the supply voltage on the side of high potential.

TECHNICAL BACKGROUND

High-potential-side driver switches, i.e. driver switches disposed on the side of high potential of the supply voltage, in the form of MOS transistors require a charge pump, in particular when DMOS transistors (MOS transistors with double diffusion) are concerned, in order to be able to bring them to an on-state with low voltage drop. Monolithically integrated charge pumps require a chip area that depends on the necessary charge transfer rate. This means, the more charging current a charge pump must be able to deliver, the more chip area is occupied by it. Integrated charge pumps which can deliver so much charging current as is required for rapidly switching high-potential-side MOS power transistors, would need a considerable part of the entire chip area. For, in order to rapidly drive a MOS power transistor to the conducting state, the gate thereof must be fed temporarily with a quite high charging current which is higher by orders of magnitude than the charging current necessary for keeping a conducting MOS transistor in the conducting state once the gate thereof has been charged.

Since charge pumps capable of making available such charging currents cannot be integrated reasonably, it is conventional to use additional charge storage means, in particular in the form of bootstrap capacitors in which charge is stored which, during the times of high charging current requirements, namely during the switching-on edges, deliver charge stored therein to the gate of the MOS transistor to be switched. To be able to fulfill this function, bootstrap capacitors must have such high capacitances that they cannot be integrated monolithically. Bootstrap capacitors thus are formed by external capacitors which must be connected to the integrated circuit via connecting areas of their own. This does not only increase the number of external circuit components but also the number of necessary connecting legs of the integrated circuit.

For slowly switching circuits (with relatively low clock frequencies of some hundred Hz) one usually uses only a charge pump. If one comes to higher switching frequencies, the average current of the charge pump is $$I = f * C_{GD} * (V_S + V_{CP}) + I_0 \quad (1)$$

In this formula

I is the average supply current of the charge pump f is the switching frequency of the high-potential-side driver $C_{GD}$=gate-drain capacitance of DMOS transistor VS=supply voltage of circuit $V_{CP}$=pumping voltage of charge pump $I_0$=bias current of driver for high-potential-side DMOS transistor to be switched.

As already mentioned, fast switching circuits usually use a bootstrap circuit to reduce the load of the charge pump. The load to be fed to the gate of the transistor in order to switch the same on rapidly is delivered by the bootstrap circuit. The load acting on the charge pump is reduced to the static current consumption of the driver circuit, namely $$I = I_0 \quad (2)$$

A conventional circuitry which is shown in FIG. 12 contains an N-channel MOS switching transistor M connected between a high-potential-side voltage supply terminal nal $V_S$ of a supply voltage source and an output terminal OUT and serving to switch a load LOAD connected between OUT and a ground terminal GND. A gate terminal G of MOS transistor M is connected to the output of a driver stage DR which is fed with a digital driver control signal via a control input SE. Driver stage DR is located between a circuit node K and a ground terminal GND and switches the gate G of MOS transistor M, in accordance with the respective potential value of the digital driver control signal, to the potential of circuit node K or to the ground potential of ground terminal GND. Circuit node K constitutes the pumping voltage output of a charge pump which has a pumping capacitor Cp, with one electrode thereof being fed with a rectangular pumping pulse sequence and the other electrode thereof being connected on the one hand via a first diode D1 to the supply voltage terminal Vs and on the other hand via a second diode D2 to circuit node K. Between K and Vs, there are disposed a third diode D3 and a fourth diode D4 in series connection. The cathodes of all four diodes D1 to D4 are directed towards circuit node A. Between a connecting point P between the two diodes D3 and D4 and OUT there is provided a bootstrap capacitor Cb.

To be adapted to be charged as quickly as possible to the desired pumping voltage, pumping capacitor Cp has a relatively small capacitance. This makes said capacitor indeed suitable for monolithic integration, but it has the effect that the charge pump cannot supply a sufficient charging current to the gate G of transistor M in order to rapidly switch the same to the conducting state. To overcome this problem, bootstrap capacitor Cb is provided which, outside the switching-on edges of transistor M, is charged from the supply voltage terminal $V_S$ via diode D4 and, at the times of occurrence of the switching-on edges of M, delivers the charge stored therein via diode D2 to the gate G of M and thus makes available the high charge which the gate G of transistor M requires for rapid switching on. To be able to fulfill this function, bootstrap capacitor Cb requires a considerably higher capacitance than pumping capacitor Cp. A capacitance as is necessary for Cb cannot be integrated monolithically with reasonable expenditure. This is why an external capacitor must be used as bootstrap capacitor Cb, which has to be connected via an additional connecting area B to the integrated driver circuit. In case of an integrated circuit having several high-potential-side MOS driver transistors, such as a full bridge circuit for a multipole stepping motor, this concept requires a bootstrap capacitor and a terminating area therefor for each high-potential-side MOS transistor of the integrated circuit.

If this known circuit arrangement with charge pump did not have a bootstrap capacitor, the gate G of MOS transistor M to be switched, during the times in which a switching-on control pulse is supplied via control input SE, would be fed completely from the charge pump.

According to equation (1), an average current to be delivered by the charge pump results as follows:

$$Im = f * C * \Delta U. \quad (3)$$

The capacitance to be charged with this current is $$C = C_{GD} + C_{GS}. \quad (4)$$

Since for $C_{GD}$ the entire voltage swing of 0 to $V_S + V_{CP}$ becomes effective, for $C_{GS}$ however only the switching-on threshold voltage Vth of transistor M, $C_{GS}$ may be neglected. That is to say, the capacitance to be charged by charge pump is $$C \approx C_{GD}. \quad (5)$$

Due to the fact that the charge pump has to accommodate the entire voltage swing $$\Delta U = V_S + V_{CP} \quad (6)$$

a correspondingly high charge pump current results according to equation (3).

SUMMARY OF THE INVENTION

The invention makes available an electric circuit comprising a high-potential-side MOS switching transistor and a charge pump, which enables faster switching of the switching transistor or a reduction of the size of the pumping capacitor of the charge pump and, thus, a reduction of the chip area covered by the charge pump, without external circuit components, such as e.g. a bootstrap capacitor being required therefor.

The idea underlying the invention is that the gate of the MOS transistor to be switched need not be fed permanently with charge from the charge pump, but that the supply voltage source can be used for this purpose as long as a voltage threshold value on the switching edge of the MOS transistor to be switched is not exceeded, said threshold value being lower than the voltage value of the supply voltage terminal on the high-potential side. As up to this threshold value the gate of the transistor to be switched is fed from the supply voltage source and the charge pump thus is responsible only for the voltage range above the threshold value, the voltage swing to be handled by the charge pump is considerably lower than in the conventional case in which the charge pump is utilized for the entire voltage range.

According to the invention, the realization of this idea in terms of circuit technology consists in that the control gate of the MOS transistor to be switched is connectable by means of a controllable switch means either to the high-potential-side supply voltage terminal or to the pumping voltage output of the charge pump, depending on whether or not a predetermined threshold value on the switching-on ascending edge of the MOS switching transistor is exceeded.

The threshold value at which switching of the control gate takes place from the high-potential-side supply voltage terminal to the pumping voltage output of the charge pump, is lower than the voltage value of the high-potential-side supply voltage terminal by an amount that is higher than the gate-source switching-on threshold value of the MOS transistor to be switched, so that the MOS transistor does not switch off during the switching-on operation before the threshold value is reached, as of which the charge pump takes over feeding of the gate of the MOS transistor.

Due to the fact that in case of the solution according to the invention, the charge pump still is responsible only for the voltage swing above the threshold value, a lower capacitance is sufficient for the pumping capacitor than in case of the conventional solution in which the charge pump is responsible for the entire voltage range to achieve the same switching-on speed as with the conventional solution. If one leaves the pumping capacitor as large as with the conventional solution, the conception according to the invention reaches an increase in the switching-on speed as compared with the conventional circuit arrangement. If in case of the circuit according to the invention, the size of the pumping capacitor and the maximum switching-on speed are left the same as in the conventional circuit, the circuit according to the invention gets along with a lower pulse repetition frequency of the pumping pulse sequence charging the pumping capacitor, which leads to a corresponding reduction of the electromagnetic interference radiation of the charge pump.

In an embodiment of the invention, the control gate of the MOS transistor to be switched is connectable via a first controllable switch to the high-potential-side supply voltage terminal and via a second controllable switch to the pumping voltage output of the charge pump. These two switches are controllable in opposite manner such that the control gate, depending on whether the threshold value on the switching-on ascending edge of the switching MOS transistor is exceeded or not, is connected either via the first switch to the high-potential-side supply voltage terminal or via the second switch to the pumping voltage output. Opposite control of these two switches means that, when one of the two switches is controlled to its conducting switching state, the respective other switch is controlled to its non-conducting switching state.

In case of an embodiment with lower circuit expenditure, control of the two switches takes place by means of a multivibrator arrangement, which in one switching state controls the switch establishing a connection to the high-potential-side supply voltage terminal to the conducting state and the switch establishing a connection to the charge pump output to the non-conducting state and which, through the ascending edge of a switching control pulse switching the MOS transistor to the conducting state, is caused to generate a delay pulse of predetermined delay duration, controls the two switches to their respective other states under the influence of the descending edge at the end of the delay pulse and controls the two switches back to their former switching states in accordance with the descending edge at the end of the switching-on control pulse. Prior to occurrence of the delay pulse and during its delay period, the switch connected to the high-potential-side supply voltage terminal is switched to the conducting state and the switch connected to the pumping voltage output is switched to the non-conducing state, whereas from the end of the delay pulse to the end of the switching-on control pulse, the switch connected to the high-potential-side supply voltage terminal is controlled to the non-conducting state and the switch connected to the pumping voltage output is controlled to the conducting state.

This embodiment of the invention is suitable when the gate capacitance of the MOS transistor to be switched and the course of the switching-on ascending edge are known with sufficient accuracy. The delay period of the delay pulse in this respect is dimensioned such that, at the end thereof, the threshold value on the switching-on ascending edge is reached. Switching over of the switch means upon reaching of this threshold value is thus is controlled only indirectly with this embodiment, namely via the duration of the delay pulse.

In case of a further embodiment of the invention, switching over of the switch means takes place in accordance with the reaching of the threshold value by a comparator, with the aid of which the voltage increase is measured during the switching on ascending edge of the MOS transistor and is compared with an auxiliary voltage determining the threshold value. The auxiliary voltage source is connected between a reference input of the comparator and the high-potential-side supply voltage terminal in such a manner that the high-potential-side supply voltage reduced by the amount of the auxiliary voltage becomes effective at the reference input as reference voltage determining the threshold value. As soon as the measured voltage value reaches the thus determined reference voltage value, the comparator issues at the output thereof a switch control signal which controls the switch means to its other state. The switch means in this respect is controlled by the comparator such that the switch connected to the high-potential-side supply voltage terminal is controlled to its conducting state and the switch connected to the pumping voltage output is controlled to its non-conducting state, as long as the voltage value measured is below the threshold value established by the reference voltage, and that the switch connected to the high-potential-side supply voltage terminal and the switch connected to the pumping voltage output are controlled to the conducting state as long as the voltage value measured is above the threshold value.

As the latter embodiment is oriented along the actual conditions, it can lead to more exact results than the embodiment mentioned first. Since the switching control thereof is based on measurements, the efficiency thereof is not dependent upon the knowledge of circuit parameters like the gate capacitance and the course of the switching-on ascending edge, and also changes of such quantities, for instance as a result of temperature influence, manufacturing tolerances for the components etc., are not affected.

In a particularly preferred embodiment of the circuit according to the invention, a frequency-modulated charge pump is used as described and elucidated in more detail in a copending U.S. patent application, Ser. No. 08/923,782, abandoned Nov. 10, 1997, of the same assignee with the title "Electric Charge Pump" [Attorney Docket No. 857063.426]. The content of this application is incorporated in the disclosure of the present application in its entirety by reference. This charge pump comprises a pumping pulse oscillator that is controllable so as to deliver different pumping pulse frequencies. Outside the time ranges of the occurrence of switching-on ascending edges, the oscillator is controlled to deliver a low pumping pulse frequency, for instance in the range of several kHz, while in the time range during the occurrence of switching-on ascending edges it is controlled to deliver a high pumping pulse frequency, for instance in the range of several MHz. A high pumping pulse frequency leads to fast charging or recharging of the pumping capacitor. During the occurrence of the switching-on ascending edges, during which the gate of the MOS transistor to be switched is to be fed with a high pump charging current to reach fast switching-on, this frequency-modulated charge pump thus has a high charge pump capacity. During the remaining times, i.e. Outside the occurrence of the switching-on ascending edges, during which the charge pump only needs to compensate leakage currents, the low pump charging capacity to which this charge pump is limited during the low pumping pulse frequency is sufficient. Due to this frequency switching of the frequency-modulated charge pump, the latter is indeed capable, without auxiliary means such as a bootstrap circuit, to deliver the high charge amount required during the switching-on ascending edges, its average current consumption and its electromagnetic interference radiation are, however, nevertheless hardly higher than in case of a charge pump that is operated exclusively with low pumping pulse frequency.

The combination of the circuit according to the invention, featuring a switching means controlled in accordance with a threshold value, with the frequency-modulated charge pump provides especially good results with regard to low average current consumption of the charge pump, lower electromagnetic interference radiation, lower chip area requirement for the charge pump and the attainment of fast transistor switching-on operations.

BRIEF DESCRIPTION OF THE DRAWINGS

The invention as well as further objects and advantageous aspects of the invention will now be elucidated in more detail by way of embodiments shown in the drawings wherein:

FIGS. 3 to 9 show signal and voltage patterns in connection with the embodiments of the invention shown in FIGS. 1 to 3.

DETAILED DESCRIPTION

Figure 12:
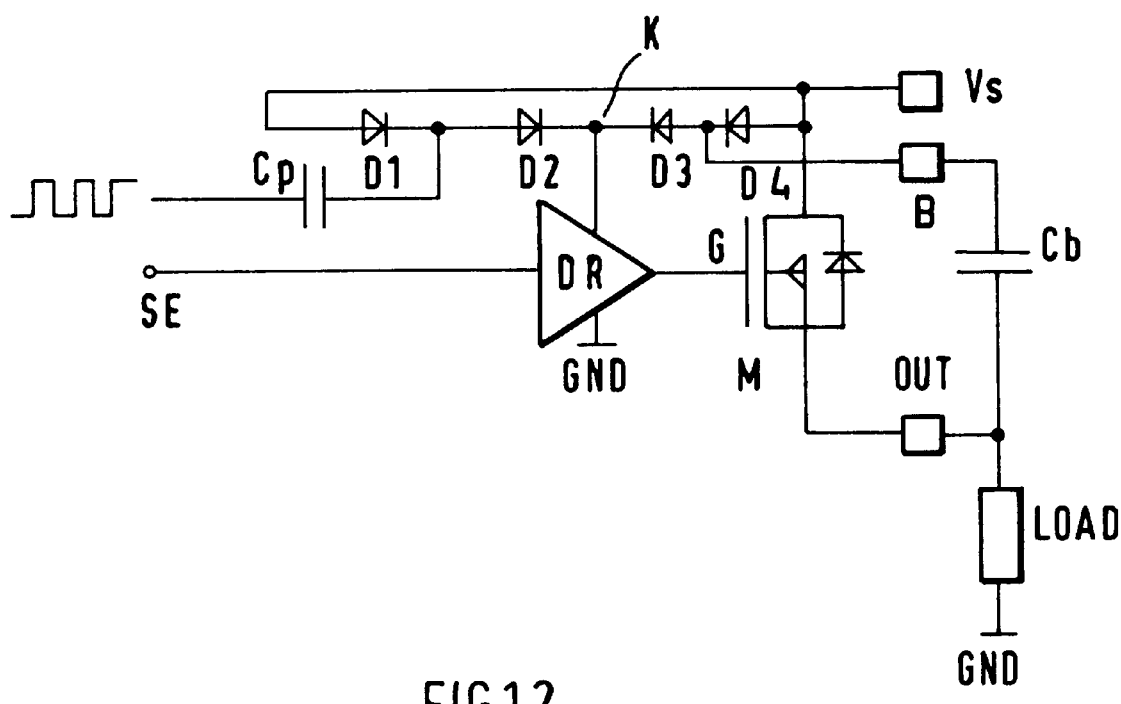
FIG. 12 shows an example of a known circuit arrangement with traditional charge pump and bootstrap capacitor.

In case of a circuit with a switching means according to the invention, as compared to the known circuit of FIG. 12 discussed above, the charge pump needs to handle charging only with regard to that part of the voltage swing from 0 to $V_S+V_{CP}$ that is above $V_S$. Thus, the part of the charge swing for which the charge pump is responsible, is only $$\Delta U = V_{CP}. \tag{7}$$

The average current to be delivered by the charge pump in the case according to the invention thus is considerably lower than in the case of the known circuit according to FIG. 12. As already mentioned, this has the effect that one may either employ a smaller pumping capacitor with correspondingly smaller chip consumption area or that an increase in the switching-on speed of the MOS transistor to be switched can be obtained with a pumping capacitor of the same size.

Figure 1:
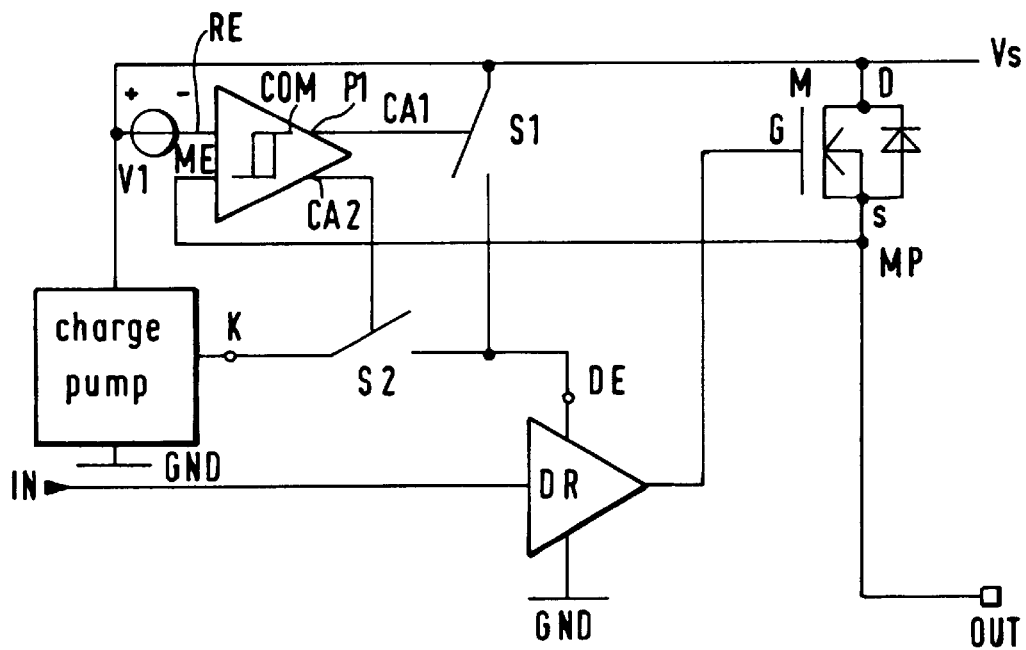
FIG. 1 shows a first embodiment of a circuit according to the invention.
Figure 2:
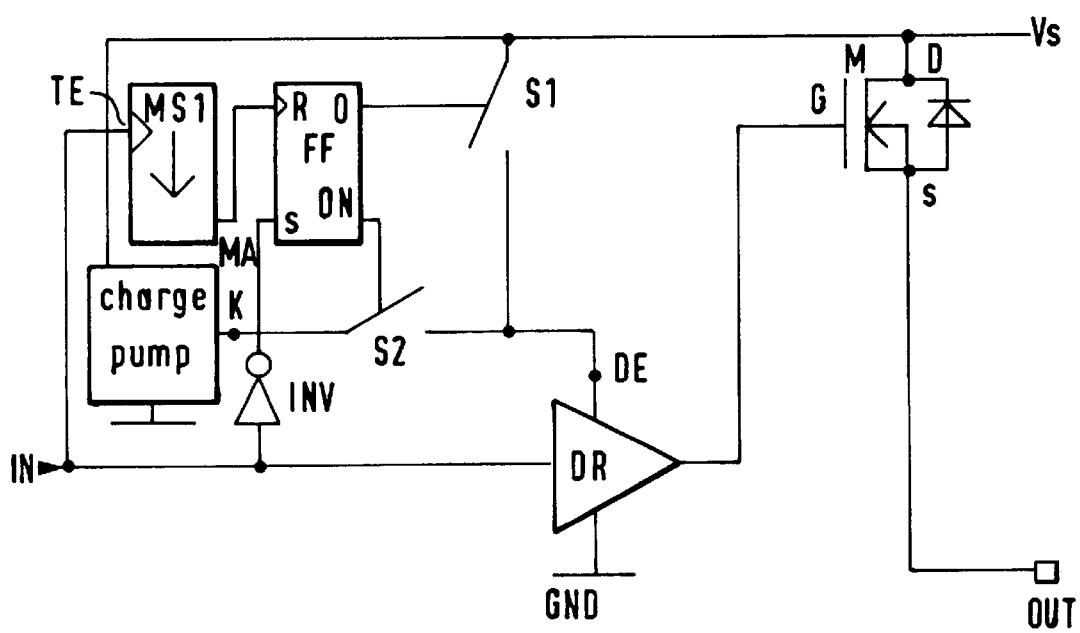
FIG. 2 a second embodiment of a circuit according to the invention.

Some elements of a circuit according to the invention shown in FIGS. 1 and 2 are identical to those of the known circuit shown in FIG. 12, namely, the MOS transistor M to be switched, the driver DR, the output terminal OUT for a load to be switched and the interconnection thereof The charge pump CP, which is only outlined as block circuit diagram in FIGS. 1 and 2, can be the same type of design as shown in FIG. 12 or of a type as in FIGS. 10 or 11, as will be discussed later. Differently from FIG. 12, the embodiments in FIGS. 1 and 2 do not have a bootstrap capacitor Cb. This permits considerable savings in area. According to the invention, a driver input DE of driver DR is not connected directly to charge pump output K, as in case of FIG. 12, but is connected on one hand via a first switch S1 to the high-potential-side supply voltage terminal $V_S$ and on the other hand via a second switch S2 to charge pump output K. The switching states of the two switches S1 and S2 are controlled with the aid of a comparator COMP1 in opposite manner, so that when one of these two switches S1 and S2 is driven to the conducting state, the respective other switch is driven to its non-conducting switching state. Comparator COMP1 is subject to hysteresis to prevent undesirable switching forth and back in the range of the switching threshold value, caused for example by noise. Comparator COMP1 has a measurement input ME connected to a measuring point MP on the load side of transistor M to be switched, at which the respective source potential of switching transistor M can be measured. A reference input RE of comparator COMP1 is connected via an auxiliary voltage source V1 to the high-potential-side supply voltage terminal $V_S$, with a negative terminal of auxiliary voltage source being directed to reference input RE.

For the auxiliary voltage, the condition holds $$V1 > V_{th}. \qquad (8)$$

This ensures that, when the potential value $V_S - V1$ constituting the switching threshold value is exceeded at the measurement point MP, the voltage supplied via conducting switch S1 and driver DR to the gate G of transistor M still is sufficiently high to hold M in the switched-on state. If this condition were not fulfilled, M would switch off before switching over of the gate from $V_S$ to the charging voltage at the pumping voltage output K has taken place.

In a preferred embodiment of the invention, the auxiliary voltage is established by the voltage drop across a MOS diode, and the auxiliary voltage source is constituted by a MOS transistor connected as a diode, with the MOS diode being matched to the transistor M to be switched, in particular by placement thereof on the same chip as the MOS transistor to be switched, appropriate dimensioning as this transistor and application of the same manufacturing steps, so that both show the same behavior with respect to certain parameters, for instance temperature-dependent parameters.

In the embodiment of the invention shown in FIG. 2, control of the switches S1 and S2 does not take place in accordance with a measurement value, but by a predetermined time schedule which is initiated with the ascending edge of a switching-on control pulse for switching-on MOS transistor M. For this purpose, there are provided a monostable multivibrator MS1 and an RS flipflop FF. A switching control signal input IN of the circuit is connected to a trigger input TE of monostable multivibrator MS1 directly and via an inverter INV to a setting input S of flipflop FF. An output MA of monostable multivibrator MS1 is connected to a resetting input R of FF. Flipflop FF has a non-inverting output Q and an inverting output QN. Via the former, the switching state of first switch S1 is controlled, while via the latter the switching state of second switch S2 is controlled.

With the assistance of FIGS. 3 to 9, the modes of operation of the embodiment of the invention shown in FIGS. 1 and 2 will be explained now. These FIGS. 3 to 9 show voltage or signal patterns at various circuit points in FIGS. 1 and 2 in the time range in which switching-on of transistor M takes place. In these drawings:

FIG. 3 shows a switching-on pulse of the switching control signal supplied to input IN;

FIG. 4 shows a delay pulse generated by monostable multivibrator MS1;

FIG. 5 shows a step-like potential increase of the voltage $V_{DE}$ at the driver input DE, caused by switching, over of switches S1 and S2;

FIG. 6 shows a course of the gate voltage $V_G$ at the control gate of switching transistor M;

FIG. 7 shows a voltage course $V_{OUT}$ at the output terminal OUT of the circuit;

FIGS. 8 and 9 show switching control voltages $V_{CA1}$ and $V_Q$ as well as $V_{CA2}$ and $V_{QN}$, respectively, for controlling switches S1 and S2.

First of all, the mode of operation of the embodiment shown in FIG. 1 shall be considered.

According to the representations in FIGS. 3 to 9 it is assumed that at a point of time t0, the switching control signal $V_{IN}$ supplied to input IN has a low potential value LOW. Switching transistor M is switched to the non-conducting state so that the output terminal OUT and thus the measurement point MP are on a low potential, for instance of 0 V. Due to the fact that the voltage at the measurement input ME of comparator COMP1 is lower than the threshold value $V_S - V1$ fed to the reference input RE thereof, a high potential appears at a first comparator output CAT, switching the first switch S1 to the conducting state, while a low potential appears at a second comparator output CA2, switching the second switch S2 to the non-conducting state. Driver input DE is thus on $V_S$. Driver DR, because of the low potential LOW of $V_{IN}$, is controlled during this time such that it connects gate G of switching transistor M to ground potential GND.

At the point of time t1, $V_{IN}$ has an ascending edge to a high potential value HIGH, to control switching transistor M to the conducting state. This potential change of $V_{IN}$ has the effect that the driver gates the potential available at its input DE, to the gate G of M. Since S1 is conducting and S2 is non-conducting, $V_S$ reaches the gate of M via DR. This results in charging of the gate capacitance with a voltage increase of the type shown in FIG. 6, which in turn entails an increase in output voltage $V_{OUT}$ of the type shown in FIG. 7.

At a point of time t2, the voltage $V_{OUT}$ measured at measurement point MP has reached the threshold value $V_S - V1$, causing switching over of the switch control signal $V_{CA1}$ from high to low potential value and switching over of the switching control signal $V_{CA2}$ from low to high potential value. As a result thereof, S1 is switched over to the non-conducting state and S2 is switched over to the conducting state, so that the voltage appearing at driver input DE is changed from $V_S$ to $V_S + V_{CP}$ (FIG. 5). This leads to a corresponding continuation of charging of the gate capacitance of M, until a gate voltage $V_S + V_{CP}$ is reached (FIG. 6), and to a further rise in output voltage $V_{OUT}$ to about $V_S$.

In case switching control signal $V_{IN}$, at the point of time t3, i.e. the end of the switching-on phase of switching transistor M, drops to the low potential value LOW, the gate G of M is connected via driver DR to ground GND, and the gate capacitance is discharged thereby virtually from one moment to the other. The voltages $V_{DE}$, $V_G$ and $V_S$ decrease in corresponding manner to the potential value 0, and comparator COMP1 is switched over to the state in which S1 is conducting and S2 is non-conducting.

Because of the dependence of the switching operation of the comparator on the voltage value measured at measurement point MP, this embodiment of the invention adjusts itself to the circumstances of the respective practical realization of such a circuit arrangement, irrespective of whether or not such circumstances are known.

In the following, the mode of operation of the embodiment shown in FIG. 2 will be considered.

It is assumed again that at the point of time t0 the switch control signal $V_{IN}$ has a low potential LOW and that thus the first switch S1 is conducting and the second switch S2 is non-conducting. At the point of time t1, at which a switching-on phase of switching transistor M is initiated through a potential transition from $V_{IN}$ to high potential HIGH, monostable multivibrator MS1 is triggered to issue a delay pulse $T_{MS1}$ (FIG. 4). At the point of time t2, flipflop FF is reset by the descending edge of delay pulse $T_{MSI}$, so that the voltage $V_Q$ at the Q output of flipflop FF jumps from high to low potential and the output voltage $V_{QN}$ at the output QN of FF jumps from low potential to high potential (FIGS. 8 and 9). As a result thereof, S1 is controlled to the conducting state and S2 to the non-conducting state, in the same manner as was already elucidated in connection with FIG. 1, along with the consequences of such switching over described in this respect.

At the point of time t3, flipflop FF, by means of the descending edge of switching control signal $V_{IN}$ that is inverted by inverter INV, again is switched via its setting input S to the condition it had at the point of time t0. This means that S1 is controlled again to the conducting state and S2 is controlled again to the non-conducting state.

In this embodiment, the point of time at which resetting of the flipflop FF takes place is dependent only and alone on the time constant of monostable multivibrator MST. This is why the course of the switching-on ascending edge at transistor M and to this end its gate capacitance must be known exactly. Voltage fluctuations of $V_S$ can be taken up by making the delay period of monostable multivibrator MS1 dependent on $V_S$.

In the circuit according to the invention, driver DR of the high-potential-side MOS switching transistor (for instance in the form of a DMOS transistor) is fed with current from the charge pump only while the output voltage $V_{OUT}$ is higher than a certain voltage value, which in optimum manner is during $$V_{OUT} > V_S - V_{GS}. \quad (9)$$

While the output voltage $V_{OUT}$ is below this value, driver DR is fed from the supply voltage $V_S$ of the chip.

If the charge transfer to the gate capacitance is neglected (operation at low frequencies) and a pulse duty cycle of 50% of switching transistor M is assumed, the driver is fed during half of the time from the charge pump, which results in the following average current:

$$I_{slow} = I0/2 \quad (10)$$

When considering the charge transfer from the charge pump to the gate of the transistor M to be switched and assuming again that the pulse duty cycle is 50%, one arrives at the following average charge pump current:

$$I_{fast} = C_{GD} * V_{CP} + I0/2 \quad (11)$$

When considering for instance stepping motor applications in the field of motor vehicles, the supply voltage $V_S$ in equation (1) is about 14 V and the charge pump voltage of equations (1) and (11) is about 7 V. When comparing these equations under the aspect that the charge pump is detached while the output voltage is lower than $V_S - V_{GS}$, one arrives at a reduction of the load acting on the charge pump by 33% to 50% of the value gatherable from equation (1) for a conventional circuit arrangement without switching means according to the invention.

Figure 10:
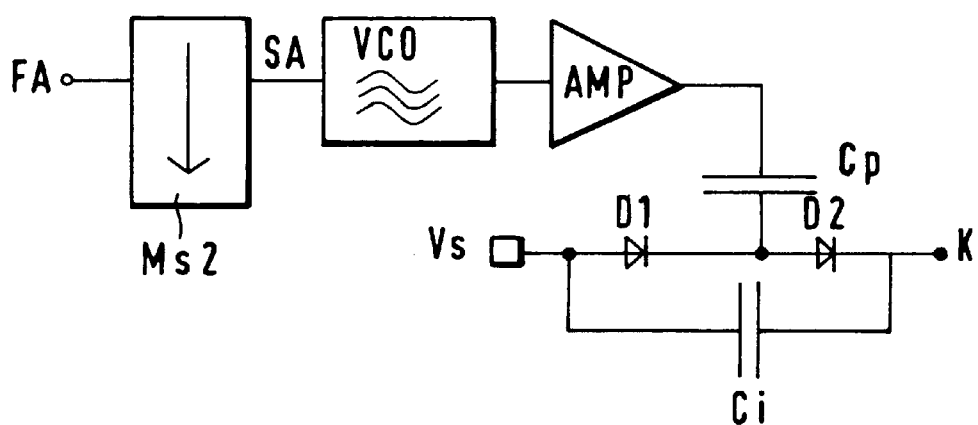
FIG. 10 shows a first embodiment of a frequency-modulated charge pump for the circuit according to the invention.
Figure 11:
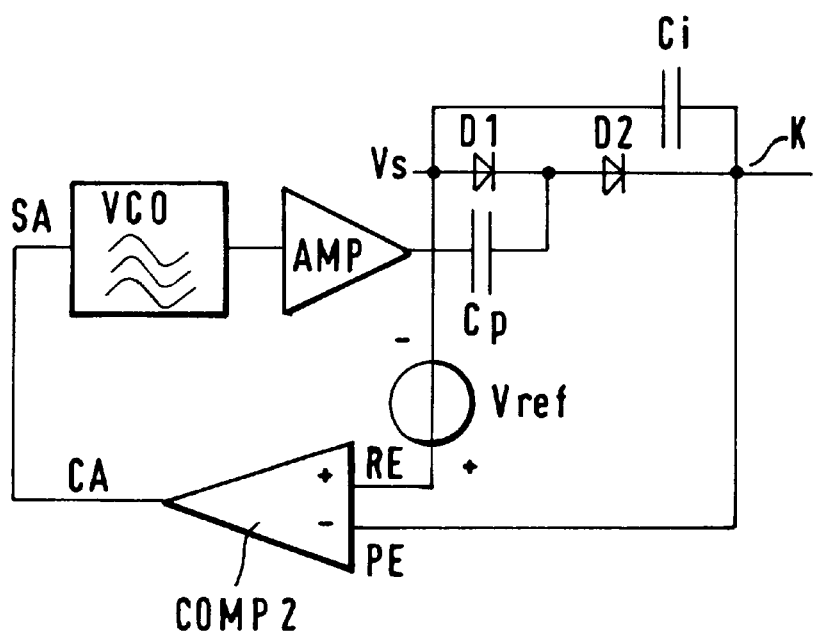
FIG. 11 shows a second embodiment of a frequency-modulated charge pump for the circuit according to the invention.

A further improvement can be achieved by using as charge pump CP a frequency-modulated charge pump which may be designed either according to FIG. 10 or according to FIG. 11.

FIG. 10 shows a first embodiment of a frequency-modulated charge pump. This charge pump includes in usual manner and as already shown in FIG. 12, a pumping capacitor Cp connected via a first diode D1 to a supply voltage terminal $V_S$ and via a second diode D2 to a pumping voltage output corresponding to circuit node K in FIG. 12. Both diodes D1 and D2 are polarized such that their cathodes are directed to circuit node K and their anodes to supply voltage terminal $V_S$. The electrode of pumping capacitor Cp remote from diodes D1 and D2 is connected to the output of an amplifier AMP having its input connected to the output of a voltage-controlled oscillator VCO. VCO has a control voltage terminal SA and the latter is connected to the output of a second monostable multivibrator MS2. The latter has a frequency control terminal FA receiving a frequency control signal from a control circuit, not shown.

The mode of operation of the charge pump shown in FIG. 10 is as follows:

In the rest condition, in which the second monostable multivibrator MS2 is in its permanently stable state, a voltage value appears at the output of MS2 which controls the voltage-controlled oscillator VCO to a low frequency, for instance in the range of some hundred KHz. The output signal of VCO is amplified by amplifier AMP, and a pumping pulse sequence having the low frequency is fed to pumping capacitor Cp, which results in relatively slow charging of the charge pump to its nominal voltage value, with relatively low current consumption of the charge pump.

Upon occurrence of circumstances requiring faster charging of the charge pump to the nominal voltage, such as at the moment when MOS transistor M shown in FIGS. 1 and 2 is switched to the conducting state, a frequency switching pulse is applied to frequency control terminal FA of MS2, which controls monostable multivibrator MS2 to its temporarily stable state for a predetermined period of time that is dependent on the time constant of MS2. During this time, the output of MS2 has a voltage value controlling the voltage-controlled oscillator VCO to a high frequency, for instance in the range of several MHz. As a result thereof, pumping capacitor Cp is charged with a pumping pulse sequence of high frequency, which results in rapid charging of the charge pump to its nominal voltage value. The gate capacitance of MOS transistor M thus can be charged quickly during the switching-on operation, so that a switching-on operation with a steep switching-on ascending edge can be reached.

After the predetermined period of time, the second monostable multivibrator MS2 falls back to its permanent stable state, which effects resetting of oscillator VCO to its low frequency and correspondingly slow charging of the charge pump.

When the charge pump shown in FIG. 10 is used for supporting the switching-on operation of a MOS transistor, a relatively high current from the charge pump is necessary only during the switching-on operation. Thereafter the charge pump merely needs to compensate leakage current losses of the gate capacitance of the switched MOS transistor, with the slow charging of the charge pump with low pumping pulse frequency being sufficient therefor.

As the embodiment shown in FIG. 10 is not flexible due to the determination of the frequency switching moment and the frequency switching duration on the basis of the triggering moment and the time constant of MS2, it should be employed only when the gate capacitance of the MOS transistor to be switched is well known and when the duration of the switching-on ascending edge thus can be estimated in correspondingly good manner. An embodiment of the charge pump shown in FIG. 10, having a specific dimensioning, then may only be used for a circuit for which it has been conceived.

More flexibility is made available by the embodiment of a frequency-modulated charge pump shown in FIG. 11. This embodiment is identical with the embodiment shown in FIG. 10 as regards pumping capacitor Cp, diodes D1, D2, amplifier AMP and voltage-controlled oscillator VCO. It differs from FIG. 10 in that it has instead of MS2 a comparator COMP2 including an inverting pumping voltage output PE connected to circuit node K as well as a non-inverting reference voltage source RE connected to a reference voltage source Vref An output CA of comparator COMP2 is connected to control voltage terminal SA of voltage-controlled oscillator VCO.

The embodiment shown in FIG. 11 works as follows:

As long as the pumping voltage present at circuit node K is above the reference voltage Vref comparator COMP2 feeds to control voltage terminal SA of VCO a frequency control voltage having a voltage value that controls VCO to a condition of low oscillator frequency, with a correspondingly slow charging operation of pumping capacitor Cp and a correspondingly slow rise of the pumping voltage. If the pumping voltage of the charge pump appearing at circuit node K drops below the voltage value of the reference voltage Vref, comparator COMP2 switches over and delivers to the control voltage terminal SA of VCO a frequency control voltage effecting a higher oscillator frequency of VCO, which leads to fast charging of Cp and thus to a fast rise of the pumping voltage at circuit node K.

This embodiment of a frequency-modulated charge pump causes regulation of the pumping voltage issued by the same depending on whether the pumping voltage has its desired or set value or is below the same. This embodiment thus does not require a frequency control signal, as it must be fed to the input FA of MS2 in FIG. 10. When the charge pump shown in FIG. 11 is used for instance for controlling the switching-on operation of a MOS transistor, the pumping, voltage at circuit node K collapses at the attempt to charge the gate capacitance of the MOS transistor to be switched-on which, in case the intervention threshold defined by Vref is fallen short of, causes switching over of the oscillator to high frequency and thus a fast rise in the pumping voltage. This process, due to the regulation character of the charge pump shown in FIG. 10, automatically adjusts itself to the respective switching-on ascending edge of the MOS transistor used, so that this rise time of the switching-on edge need not be known at all. Because of this adjustability, a charge pump according to FIG. 11 may also be used for quite different MOS transistors and circuits composed therewith.

In FIGS. 10 and 11 there is provided one integration capacitor Ci each, by means of which the voltage changing in stepped manner across pumping capacitor Cp is integrated for smoothing purposes. At the circuit node K and thus at the charge pump output a smoothed pumping voltage is available then.

The present invention is likely to have various alterations, modifications and improvements which will be readily apparent to a person skilled in the art. Such alterations, modifications and improvements are intended to be part of the disclosure and within the spirit and scope of the present invention. Accordingly, the foregoing description is by way of example only and not intended to be limiting.

What is claimed is:

1. An electric circuit, comprising at least one MOS switching transistor disposed on the side of high potential and a voltage booster supporting the switching-on phase of the MOS switching transistor with a pumping voltage higher than the potential of the supply voltage on the side of high potential, being available from a pumping voltage output thereof, with a control gate of the MOS switching transistor being connectable by means of controllable switch means to a high-potential-side supply voltage terminal or to the pumping voltage output depending on whether a predetermined threshold value on the switching-on ascending edge of the MOS switching transistor is exceeded or not.

2. The circuit of claim 1, wherein the control gate of the MOS switching transistor is connectable via a first controllable switch to the high-potential-side supply voltage terminal and via a second controllable switch to the pumping voltage output and the two switches are adapted to be controlled in opposite manner by means of a control circuit in such a manner that the control gate, depending on whether the predetermined threshold value on the switching-on ascending edge of MOS switching transistor is exceeded or not, is connectable either via the first switch to the high-potential-side supply voltage terminal or via the second switch to the pumping voltage output.

3. The circuit of claim 1, wherein the MOS switching transistor is arranged between the high-potential-side supply voltage terminal and a load terminal for a load to be switched by means of the MOS switching transistor.

4. The circuit of claim 2, wherein the control circuit comprises a first comparator having a measurement value input connected to a measuring circuit point located on the side of the load terminal of the MOS switching transistor, a reference input connected to an auxiliary voltage source, and a comparator output controlling the switching states of the two switches.

5. The circuit of claim 4, wherein the auxiliary voltage source comprises a MOS transistor connected as a diode, which is of the same transistor type as the MOS transistor to be switched and is formed on the same chip as the MOS transistor to be switched and with the same production process as the MOS transistor.

6. The circuit of claim 4, wherein the voltage value of the auxiliary voltage source is higher than the gate-source switching-on threshold voltage necessary for switching-on the MOS switching transistor.

7. The circuit of claim 4, wherein the comparator output has an inverting output terminal and a non-inverting output terminal which are each connected to a control terminal of one of the two switches.

8. The circuit of claim 4, wherein the comparator output constitutes for both switches a common output terminal that is connected to a control terminal of one of the two switches directly and to a control terminal of the other one of the two switches via an inverter.

9. The circuit according to claim 1 wherein the switching-on edge is the ascending edge.

10. An electric circuit comprising a MOS switching transistor, a ground terminal for receiving ground potential;

a supply voltage terminal for receiving a supply voltage;

a control signal input for receiving a control signal controlling the switch-on operation of the MOS switching transistor;

a charge pump for supporting the switching-on phase of the MOS switching transistor and outputting at an output terminal thereof a pump voltage that is higher than a supply voltage of the circuit; and a switch means for coupling the control gate of the MOS switching transistor with either the supply voltage terminal or the output terminal of the switchable charge pump with a predetermined timing depending on a control signal controlling the switch-on operation of the MOS switching transistor.

11. The circuit of claim 10, having a control circuit comprising a first monostable multivibrator and a RS flipflop, wherein the first monostable multivibrator being triggered by the ascending edges of the control signals, controlling the switching states of the MOS switching transistor, so as to issue delay pulses of predetermined delay duration, the flipflop being set through the descending edge the respective delay pulse and reset through the following descending edge or the respective switching control pulse, and wherein the switch means having a first and a second switch, the control input of the first switch being connected to a Q output and the control input of the second switch being connected to a QN output of the flipflop.

12. The circuit of claim 11, wherein a trigger input of the first monostable multivibrator is connected directly to a switching control pulse source and a setting input of the flipflop is connected thereto via an inverter, and a resetting input of the flipflop is connected to a delay pulse output of the first monostable multivibrator.

13. The circuit of claim 10, wherein the charge pump thereof is adapted to be charged by means of a periodical pumping pulse sequence whose pulse repetition frequency is controllable to different frequency values.

14. The circuit of claim 13, wherein the charge pump thereof comprises:
a pumping capacitor having one end coupled with an output of a pumping pulse source for generating the periodical pumping pulse sequence and the other end coupled on the one hand via a first diode with the high-potential-side supply voltage terminal and on the other hand via a second diode with a pumping voltage output of the charge pump.

15. The circuit of claim 13, wherein the pulse repetition frequency is adapted to be switched over between two frequency values.

16. The circuit of claim 15, wherein the pulse repetition frequency is adapted to be switched over between a low frequency value in the KHz range and a high frequency value in the MHz range.

17. The circuit of any one of claim 13, wherein the pumping pulse source comprises a voltage-controlled oscillator having a control voltage input coupled with the output of a control voltage source being controlled to issue various control voltage values.

18. The circuit of claim 17, wherein the control voltage source comprises a second monostable multivibrator having a multivibrator input connected to a frequency control signal source, and a multivibrator output connected to the control voltage input of the voltage-controlled oscillator, and delivering at its multivibrator output a voltage value leading to a low pulse repetition frequency in the permanent stable state thereof, and a voltage value leading to a high pulse repetition frequency in the temporary stable state thereof.

19. The circuit of claim 17, wherein the control voltage source comprises a second comparator which has a set value input connected to a reference voltage source, an actual value input connected to the pumping voltage output, and a comparator output connected to the control voltage input of voltage-controlled oscillator, and which, depending on whether the pumping voltage at the pumping voltage output reaches a predetermined set value or not, delivers at its comparator output a voltage value leading to a low pulse repetition frequency or a voltage value leading to a high pulse repetition frequency.

20. The circuit of claim 13, wherein an integration capacitor is provided in which the charging voltage of the pumping capacitor is integrated and the integrated charging voltage of which is available at the pumping voltage output as pumping voltage.

21. The circuit of claim 20, wherein the integration capacitor of the charge pump is constituted by the gate capacitance of the MOS switching transistor.

22. The circuit of claim 18, wherein the control gate of the MOS switching transistor is connected to the output of a driver circuit delivering rectangular switching control signals, and the second monostable multivibrator is controllable through the ascending edges of the switching control signal to its temporary stable state.

23. An electric circuit, comprising at least one MOS switching transistor disposed on the side of high potential of the circuit and a voltage booster supporting the switching-on phase of the MOS switching transistor with a pumping voltage higher than the potential of the supply voltage on the side of high potential, being available from a pumping voltage output thereof, with a control gate of the MOS switching transistor being alternatively connectable by means of controllable switch means to either of a high-potential-side supply voltage terminal and the pumping voltage output depending on whether a predetermined threshold value on the switching-on ascending edge of the MOS transistor is exceeded;

a first controllable switch for connecting the gate of the MOS switching transistor to the high-potential-side supply voltage terminal and a second controllable switch for connecting the control gate of the MOS switching transistor to the pumping voltage output, the first and second controllable switches adapted to be controlled in opposite manner by means of a control circuit in such a manner that the control gate, depending on whether the predetermined threshold value on the switching-on ascending edge of the MOS switching transistor is exceeded or not, is connectable either via the first switch to the high-potential-side supply voltage terminal or via the second switch to the pumping voltage output;

the control circuit further comprising a first comparator having a measurement value input connected to a measuring circuit point located on the side of the load terminal of the MOS switching transistor, a reference input connected to an auxiliary voltage source, and a comparator output controlling the switching states of the first and second controllable switches; and a voltage detector for measuring a voltage at the output terminal of the MOS transistor, wherein the gate of the MOS transistor is connected to the pumping voltage output when the measured voltage is higher than a predetermined threshold value.

24. An electric circuit, comprising at least one MOS switching transistor disposed on the side of high potential of the circuit and a voltage booster supporting the switching-on phase of the MOS switching transistor with a pumping voltage higher than the potential of the supply voltage on the side of high potential, being available from a pumping voltage output thereof, with a control gate of the MOS switching transistor being alternatively connectable by means of controllable switch means to either of a high-potential-side supply voltage terminal and the pumping voltage output depending on whether a predetermined threshold value to enable the MOS transistor is exceeded; and a first controllable switch for connecting the gate of the MOS switching transistor to the high-potential-side supply voltage terminal and a second controllable switch for connecting the control gate of the MOS switching transistor to the pumping voltage output, the first and second controllable switches adapted to be controlled in opposite manner by means of a control circuit in such a manner that the control gate, depending on whether the predetermined threshold value to enable the MOS switching transistor is exceeded or not, is connectable either via the first switch to the high-potential-side supply voltage terminal or via the second switch to the pumping voltage output.

25. An electric circuit, comprising at least one MOS switching transistor disposed on the side of high potential of the circuit and a voltage booster supporting the switching-on phase of the MOS switching transistor with a pumping voltage higher than the potential of the supply voltage on the side of high potential, being available from a pumping voltage output thereof, with a control gate of the MOS switching transistor being alternatively connectable by means of controllable switch means to either of a high-potential-side supply voltage terminal and the pumping voltage output depending on whether a predetermined threshold value to enable the MOS transistor is exceeded;

a first controllable switch for connecting the gate of the MOS switching transistor to the high-potential-side supply voltage terminal and a second controllable switch for connecting the control gate of the MOS switching transistor to the pumping voltage output, the first and second controllable switches adapted to be controlled in opposite manner by means of a control circuit in such a manner that the control gate, depending on whether the predetermined threshold value to enable the MOS switching transistor is exceeded or not, is connectable either via the first switch to the high-potential-side supply voltage terminal or via the second switch to the pumping voltage output; and the control circuit further comprising a first comparator having a measurement value input connected to a measuring circuit point located on the side of the load terminal of the MOS switching transistor, a reference input connected to an auxiliary voltage source, and a comparator output controlling the switching states of the first and second controllable switches.

* * * * *

UNITED STATES PATENT AND TRADEMARK OFFICE
CERTIFICATE OF CORRECTION

PATENT NO : 5,914,589
DATED : June 22, 1999
INVENTOR : Ricardo Erckert

It is certified that errors appear in the above-identified patent and that said Letters Patent are hereby corrected as shown below:

Section [73], Assignee, on the front cover of the Issued Patent should read --SGS-Thomson Microelectronics GmbH, Grasbrunn, Germany--.

Signed and Sealed this

First Day of May, 2001

*Attest:*

NICHOLAS P. GODICI

*Attesting Officer*      *Acting Director of the United States Patent and Trademark Office*